United States Patent
Kwan

(10) Patent No.: US 7,289,212 B2
(45) Date of Patent: *Oct. 30, 2007

(54) LITHOGRAPHIC APPARATUS, DEVICE MANUFACTURING METHOD AND DEVICE MANUFACTURING THEREBY

(75) Inventor: Yim Bun Patrick Kwan, Aalen (DE)

(73) Assignee: ASML Netherlands B.V., Veldhoven (NL)

( * ) Notice: Subject to any disclaimer, the term of this patent is extended or adjusted under 35 U.S.C. 154(b) by 475 days.

This patent is subject to a terminal disclaimer.

(21) Appl. No.: 10/825,215

(22) Filed: Apr. 16, 2004

(65) Prior Publication Data

US 2004/0263846 A1 Dec. 30, 2004

Related U.S. Application Data

(63) Continuation-in-part of application No. 09/928,462, filed on Aug. 22, 2001, now Pat. No. 6,819,425.

(30) Foreign Application Priority Data

Aug. 24, 2000 (EP) .................................. 00307306

(51) Int. Cl.
  *G01B 11/00* (2006.01)
  *G01B 11/14* (2006.01)
  *G03B 27/42* (2006.01)
  *G03B 27/32* (2006.01)

(52) U.S. Cl. ...................... 356/399; 356/400; 356/401; 356/614; 355/53; 355/77

(58) Field of Classification Search ...................... None
See application file for complete search history.

(56) References Cited

U.S. PATENT DOCUMENTS

| 4,540,277 | A | | 9/1985 | Mayer et al. |
| 4,769,680 | A | * | 9/1988 | Resor et al. ................... 355/43 |
| 4,772,835 | A | | 9/1988 | Weaver et al. |

(Continued)

FOREIGN PATENT DOCUMENTS

EP 0 652 487 A1 5/1995

(Continued)

OTHER PUBLICATIONS

Jim Dey, "Precision wafer stepper utilizing a two-dimensional optical encoder", SPIE Semiconductor Microlithography VI, vol. 275 pp. 29-34 (1981), XP009039090.

(Continued)

*Primary Examiner*—Gregory J. Toatley, Jr.
*Assistant Examiner*—Gordon J. Stock, Jr.
(74) *Attorney, Agent, or Firm*—Pillsbury Winthrop Shaw Pittman LLP

(57) ABSTRACT

The X, Y and Rx positions of a mask stage are measured using two optical encoder-reading heads measuring displacements of respective grid gratings mounted on the mask stage. The grid gratings are preferably provided on cut-away portions of the mask table so as to be coplanar with the pattern on the mask itself. Measurements of the table position in the other degrees of freedom can be measured with capacitative or optical height sensors.

27 Claims, 9 Drawing Sheets

U.S. PATENT DOCUMENTS

| | | | |
|---|---|---|---|
| 4,780,617 A | 10/1988 | Umatate et al. | |
| 4,820,055 A * | 4/1989 | Muller | 356/401 |
| 5,142,146 A * | 8/1992 | Morokuma | 250/237 G |
| 5,151,750 A | 9/1992 | Magome et al. | |
| 5,151,754 A * | 9/1992 | Ishibashi et al. | 356/490 |
| 5,249,016 A | 9/1993 | Tanaka | |
| 5,448,332 A | 9/1995 | Sakakibara et al. | |
| 5,477,304 A | 12/1995 | Nishi | |
| 5,493,403 A | 2/1996 | Nishi | |
| 5,502,311 A | 3/1996 | Imai et al. | |
| 5,504,407 A | 4/1996 | Wakui et al. | |
| 5,534,970 A | 7/1996 | Nakashima et al. | |
| 5,585,925 A | 12/1996 | Sato et al. | |
| 5,591,958 A | 1/1997 | Nishi et al. | |
| 5,610,715 A * | 3/1997 | Yoshii et al. | 356/499 |
| 5,646,413 A | 7/1997 | Nishi | |
| 5,658,700 A | 8/1997 | Sakai | |
| 5,677,758 A | 10/1997 | McEachern et al. | |
| 5,699,145 A | 12/1997 | Makinouchi et al. | |
| 5,715,037 A | 2/1998 | Saiki et al. | |
| 5,721,607 A | 2/1998 | Ota | |
| 5,721,608 A | 2/1998 | Taniguchi | |
| 5,801,832 A | 9/1998 | Van Den Brink | |
| 5,850,279 A | 12/1998 | Nara et al. | |
| 5,929,976 A | 7/1999 | Shibuya et al. | |
| 5,978,069 A | 11/1999 | Kato | |
| 5,989,761 A | 11/1999 | Kawakubo et al. | |
| 6,341,007 B1 | 1/2002 | Nishi et al. | |
| 6,400,441 B1 | 6/2002 | Nishi et al. | |
| 6,781,694 B2 * | 8/2004 | Nahum et al. | 356/420 |
| 6,819,425 B2 * | 11/2004 | Kwan | 356/399 |
| 7,102,729 B2 * | 9/2006 | Renkens et al. | 355/53 |
| 2002/0145717 A1 * | 10/2002 | Baselmans et al. | 355/55 |

FOREIGN PATENT DOCUMENTS

| | | |
|---|---|---|
| EP | 0 951 054 A1 | 10/1999 |
| JP | 55-167653 U | 12/1980 |
| JP | 57-183031 | 11/1982 |
| JP | 60-47418 | 3/1985 |
| JP | 63-87725 | 4/1988 |
| JP | 63-261850 | 10/1988 |
| JP | 2-166717 | 6/1990 |
| JP | 5-175098 | 7/1993 |
| JP | 6-291017 | 10/1994 |
| JP | 7-302748 | 11/1995 |
| JP | 8-51069 | 2/1996 |

OTHER PUBLICATIONS

European Search Report issued on EP Application No. 01307129.5 dated Feb. 8, 2006.

IBM Technical Disclosure Bulletin, "Remote Location Optical Registration System," vol. 30, No. 12, May 1988, pp. 209-210.

Patent Abstract of Japanese Patent Application LaidOpen No. 57-183031.

Patent Abstract of Japanese Patent Application LaidOpen No. 63-261850.

* cited by examiner

LITHOGRAPHIC APPARATUS, DEVICE MANUFACTURING METHOD AND DEVICE MANUFACTURING THEREBY

This application is a continuation-in-part application of U.S. patent application Ser. No. 09/928,462, filed Aug. 22, 2001 now U.S. Pat. No. 6,819,425, which claims priority to EP 00307306.1 filed Aug. 24, 2000, the contents of which are incorporated herein by reference in their entirety.

BACKGROUND OF THE INVENTION

1. Field of the Invention

The present invention relates generally to lithographic projection apparatus.

2. Description of the Prior Art

The term "patterning device" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.
- A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic elements. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.
- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning devices as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

One of the most challenging requirements for microlithography for the production of integrated circuits as well as liquid crystal display panels is the positioning of tables. For example, sub-100 nm lithography demands substrate- and mask-positioning stages with dynamic accuracy and matching between machines to the order of 1 nm in all 6 degrees of freedom (DOF), at velocities of up to 2 ms$^{-1}$.

A popular approach to such demanding positioning requirements is to sub-divide the stage positioning architecture into a coarse positioning module (e.g. an X-Y table or a gantry table) with micrometer accuracies but travelling over the entire working range, onto which is cascaded a fine positioning module. The latter is responsible for correcting for the residual error of the coarse positioning module to the last few nanometers, but only needs to accommodate a very limited range of travel. Commonly used actuators for such nano-positioning include piezoelectric actuators or voice-coil type electromagnetic actuators. While positioning in the fine module is usually effected in all 6 DOF, large-range motions are rarely required for more than 2 DOF, thus easing the design of the coarse module considerably.

The micrometer accuracy required for the coarse positioning can be readily achieved using relatively simple position sensors, such as optical or magnetic incremental encoders. These can be single-axis devices with measurement in one DOF, or more recently multiple (up to 3) DOF devices such as those described by Schäffel et al "Integrated electro-dynamic multicoordinate drives", Proc. ASPE Annual Meeting, California, USA, 1996, p.456-461. Similar encoders are also available commercially, e.g. position measurement system Type PP281R manufactured by Dr. J. Heidenhain GmbH. Although such sensors can provide sub-micrometer level resolution without difficulty, absolute accuracy and in particular thermal stability over long travel ranges are not readily achievable.

Position measurement for the mask and substrate tables at the end of the fine positioning module, on the other hand, has to be performed in all 6 DOF to sub-nanometer resolution, with nanometer accuracy and stability over the entire working range. This is commonly achieved using multi-axis interferometers to measure displacements in all 6 DOF, with redundant axes for additional calibration functions (e.g. calibrations of interferometer mirror flatness on the substrate table).

Although the technology behind such interferometer systems is very mature, their application is not without problems. One of the most significant drawbacks of the interferometer is the dependence of wavelength on environmental pressure and temperature, as described by Schellekens P. H J. "Absolute measurement accuracy of technical laser interferometers" Ph. D. Thesis, T U Eindhoven, 1986, which is given by:

$$\lambda_a = \frac{\lambda_v}{\eta} \quad (1)$$

where:

$$(\eta - 1)_{P,T,H,C} = \frac{D \times 0.104126 \times 10^{-4} \cdot P}{1 + 0.3671 \times 10^{-2} \cdot T} - 0.42066 \times 10^{-9} \cdot H \quad (2)$$

D=0.27651754×10$^{-3}$×[1+53.5×10$^{-8}$ (C-300)]
P: atmospheric pressure [Pa]
T atmospheric temperature [° C]
H water vapor pressure [Pa]
C $CO_2$ content [ppm]

This remains one of the major problems in the thermal design of an optical lithography system. Typically, both temperature and pressure along the optical path of the interferometer has to be actively controlled to mK and mbar levels by the use of dry, clean (to better than Class 1) air, e.g. supplied by air showers.

In addition, the mounting adjustment of multi-axis interferometers for orthogonality and coplanarity, as well as the subsequent calibration procedure to remove any residual errors, are both extremely complex and time consuming. Even after such adjustments and calibration procedures, the measurement is only accurate if the relative positions of the interferometer blocks remain stable. The nanometer dimensional stability requirements of the metrology frame, on which the interferometer blocks are mounted, imply that the metrology frame has either to be made out of a material with low or zero coefficient of thermal expansion (CTE), such as Invar or Zerodur, or active thermal stabilization to mK levels, or both. Furthermore, the pointing stability of the laser beam during operation may introduce additional cosine or Abbe errors which need to be calibrated out on a regular basis by some form of automated routine.

An interferometer system is of course only a relative measuring system, capable of measuring changes in length (of optical path, to be precise). A zero reference in each degree of freedom can only be generated with additional equipment, such as so-called alignment sensors as described in WO 98/39689.

Although metrology frames in state-of-the-art lithography systems are highly isolated from ambient vibration, thermal deformation of the order of 0.5×10$^{-9}$ m is not totally avoidable. It is, therefore, desirable that the position of the substrate or mask tables be measured directly relative to the optical imaging system. Mounting of interferometers directly on the lens, for example, is both difficult and undesirable. Relative length measurement to the lens can, however, still be realized by differential interferometry, at the expense of the added complication and cost.

The multiple beams required for such 6 DOF interferometric measurement cannot be adequately supplied with sufficient optical power by one laser source, thus requiring multiple sources with additional wavelength matching demands. The total thermal dissipation of the lasers and detectors combined exceeds 50W, which is well above the level allowable for the dimensional stability of the metrology frame. Both the lasers and the detectors have thus to be mounted remotely via optical links.

As can be seen, whilst the resulting interferometry based system is technically viable and has been implemented in practice, it is by no means simple, robust and economical.

The most obvious alternative to interferometers for long-range displacement measurements with micrometer or nanometer resolutions is the optical incremental encoder. Optical encoders with sub-nanometer resolutions have become available in recent years and have been promoted as viable alternatives to single-axis interferometry. The sub-nanometer resolution is achieved by using fine-pitched gratings (down to 512 nn) in combination with interpolation techniques (up to 4096×). Most of such encoders, however, provide length measurement in 1 DOF only. As such, they do not lend themselves readily to nano-metrology in all 6 DOF simultaneously. Amongst the difficulties is the high level of crosstalk of the displacement signal to parasitic movements in the other 5 DOF.

SUMMARY OF THE INVENTION

It is an object of the invention to provide an improved displacement measuring system for use in a lithographic projection apparatus, and especially a system in which problems suffered by existing systems are solved or ameliorated.

According to the invention there is provided a lithographic projection apparatus comprising:

a radiation system for providing a projection beam of radiation;

a support structure for supporting a patterning device, the patterning device serving to pattern the projection beam according to a desired pattern;

a substrate table for holding a substrate;

a projection system for projecting the patterned beam onto a target portion of the substrate; characterized by:

displacement measuring system for measuring the position of a moveable object comprising one of said support structure and said substrate table in at least two degrees of freedom, said displacement measuring system comprising at least one grid grating mounted on said moveable object and at least one sensor head for measuring displacements of said grid grating in two degrees of freedom.

The invention also provides a lithographic projection apparatus comprising:

a radiation system for providing a projection beam of radiation;

a support structure for supporting a patterning device, the patterning device serving to pattern the projection beam according to a desired pattern;

a substrate table for holding a substrate;

a projection system for projecting the patterned beam onto a target portion of the substrate; and:

a displacement measuring system for measuring the position of a moveable object comprising one of said support structure and said substrate table in at least two degrees of freedom, said displacement measuring system comprising at least one grid grating mounted on a reference frame and at least one sensor head mounted on said moveable object for measuring displacement of said moveable object relative to said grid grating in two degrees of freedom. A major advantage of the 2D grid encoder is that the measurement grid can be permanently fixed on a grating plate. Even if the grating is not perfectly orthogonal, straight or linear, this remains unchanged as long as the grating plate is free from distortions (either thermal or elastic). Such linearity or orthogonality errors can be calibrated out without too much difficulty by, for example, vacuum interferometry. The calibration only needs to be performed once for each grating, or not at all if one is only interested in positional repeatability. The use of a grid encoder essentially removes the guideway straightness and orthogonality from the error budget, when compared with single-axis encoder-based solutions.

The present invention can therefore provide an alternative solution to interferometry, at least in 3 coplanar degrees of freedom (X, Y, Rz), by combining the principles of grid gratings and sub-nanometer encoding. The invention can both be practiced for positional measurement of a mask stage or a substrate stage.

To address the issue of output sensitivity to parasitic movements in the remaining degrees of freedom of encoders with nanometer resolutions, systems used in the present invention make use of the interference pattern of the first order diffraction of the collimated incidence light from a monochromatic source off the grating. This method ensures that the signals at the detector are free from high-order harmonics, making it possible to perform very high interpolation without incurring excessive errors. In addition, it allows a much larger position latitude of the reading head relative to the grating in the non-measurement directions. For more information on such a detector see U.S. Pat. No. 5,643,730, which document is hereby incorporated herein by reference.

A typical system used in the present invention comprises a grid grating with a period of 10 μm or less, with an interferential reading (encoder) head in 2 DOF and an interpolator of up to a factor of 20,000 for each axis.

For the measurement of the remaining 3 DOF, namely Z, Rx and Ry, various short range displacement sensing technologies can be employed, including optical triangulation, fiber optic back-scatter, interferometric sensors (which can have a very short optical path in air and therefore be much less sensitive to environmental fluctuations), capacitive or inductive sensors.

Currently, capacitive and optical sensors are preferred to the other measuring principles, though the others may be appropriate in some applications of the invention. The use of inductive sensors against a Zerodur chuck is problematic, as conductive targets are required for the sensors. Pneumatic proximity sensors (air micrometer), on the other hand, suffer from limited resolution and working distance, as well as exerting a finite force on the target.

Optical sensors, whether interferometric or triangulated, can be designed with a relatively large (a few millimeters) working distance, which helps to ease assembly tolerances. Compared to capacitive sensors, they usually have higher bandwidths, and can be configured as an absolute distance sensor. As an absolute sensor, however, they do suffer from long-term stability problems due to mechanical drifts (thermal or otherwise) requiring periodic calibration.

Capacitive sensors, on the other hand, can be designed as an absolute sensor with very high stability. Furthermore, the distance measurement is performed over a relatively large target surface, which helps to reduce any effects of localized unevenness of the target surface. Despite their limited measurement range and stand-off clearance, they are currently the preferred choice in lithographic applications.

An encoder based nano-positioning system offers an advantageous alternative to interferometry and is much simpler to implement. Better measurement stability can be achieved by the fact that the measurement grid in the X-Y plane is permanently fixed onto the mask table, which when implemented in a zero-CTE material, such as Zerodur, is both long-term dimensionally stable and thermally insensitive. This eases considerably the stringent demand on environmental control of the area immediately around the optical path of the interferometer beams, particularly in the case of a lithographic projection apparatus employing wavelengths of 157 nm or below. Such devices require to be purged with gas, that does not absorb the beam (which is strongly absorbed in air), and by avoiding the need for air showers over the length of the interferometer beams, the present invention can substantially reduce consumption of purge gas.

The mask position relative to the projection optics can also be measured in the encoder solution without resorting to a differential configuration. Although placing the reading head directly on the top of the projection optics does put more demands on the thermal dissipation of the former, techniques to minimize this such as active cooling or remote light source and detectors linked by optical fibers are already available and already deployed in state-of-the-art interferometer systems.

The encoder based nano-positioning system may also be arranged as follows: A first sensor head is arranged on the substrate table, and a first grating is mounted on the projection system or on a frame. In one embodiment, such a frame is at least substantially stationary relative to the projection system, which means that the relative displacement of the projection system and the part of the frame the first grating is attached to is negligible. If this cannot be achieved, it is envisaged that displacement of the frame relative to the projection system is measured as well. It is also envisaged that in case the frame is deemed to be substantially stationary, displacement of the frame relative to the projection system is measured as well, in order to make sure that the relative displacement actually is negligible.

The first sensor head can be mounted on top of the substrate table, facing upwards to the first grating, which is mounted on the projection system or on the frame. The sensor head and the first grating are arranged in such a way that during all movements of the substrate table, the first sensor head and the first grating are able to cooperate in measuring displacement of the substrate table relative to the projection system.

In such an arrangement, the measurement system may also comprise a first z-sensor. The z-sensor and the first grating cooperate in determining the displacement of the substrate table relative to the projection system in a third direction of measurement which is perpendicular to a plane defined by the first direction of measurement and the direction of the lines of the first grating. For example, when the first direction of measurement is the x-direction and the sensor head sends the polarized beam of radiation in z-direction to the first grating, the lines of the first grating extend in y-direction. In that case, the plane defined by the first direction of measurement and the direction of the lines of the first grating is the x-y-plane. In that case, the third direction of measurement is the direction perpendicular to the x-y-plane, thus the z-direction. So, in this situation the first grating is not only used for measuring displacement of the substrate table relative to the projection system. in x-direction, but also for measuring displacement of the substrate table relative to the projection system in z-direction.

It is envisaged that the z-sensor can be an interferometer, and that the first grating has a reflective face cooperating with the interferometer. It is possible that the grating comprises two, mutually parallel reflective faces, for example due to the nature of the grating. This can be the case if the grating comprises two groups of parallel lines. In such a case, the distance between the reflective faces is preferably n times the wavelength of the beam of the interferometer, n being a positive integer (1,2,3,4, . . . ).

Alternatively, the z-sensor can be a capacitive sensor. For functioning, a capacitive sensor needs an electrically conductive counter plate, that is arranged at a small distance, such as a few millimeters, from the capacitive sensor in the direction of measurement. By making at least a part of the first grating electrically conductive, the first grating serves as a counter plate for the capacitive sensor. It is known to make gratings out of glass, with lines of chromium. By interconnecting the lines and connecting them to ground, such a grating can be used with a capacitive sensor.

In the lithographic projection system according to the invention, the number of interferometers used for measuring the displacements of the substrate table relative to the projection system is reduced. This way, the costs of both the measurement system and the substrate table are reduced.

It is envisaged that the displacements of the substrate table relative to the projection system in both the first direction and the second direction are measured using sensor heads or reading heads. In this embodiment, the lithographic apparatus is equipped with a measurement system comprising a first sensor head and a second sensor head. To this end, the first grating may include not only a first group of mutually parallel lines, extending perpendicular to the first direction of measurement and but also a second group of mutually parallel lines, extending perpendicular to the second direction of measurement. The first grating may be provided with a checkerboard pattern, for use in association with both the first and the second sensor head. In that case, the transitions between the light and the dark areas of the checkerboard pattern take over the role of the parallel lines of the grating. Alternatively, a separate second grating may be present for use by the second sensor head. The first and the second sensor head are preferably integrated in a single sensor unit.

In another embodiment, the measurement system is adapted to measure displacements of the substrate table relative to the projection system in all three degrees of freedom in the plane defined by the first and the second direction of measurement by using sensor heads. If this plane is the x-y-plane, this means that the translational displacements of the substrate table in the x-direction and in the y-direction and the rotational displacement about an axis in z-direction are measured using sensor heads.

For this purpose, the measurement system comprises in this embodiment a first, a second and a third sensor head. Two of these sensor heads are used for measuring the displacements of the substrate table in the first direction of measurement and the other encoder is used for measuring the displacements of the substrate table in the second direction of measurement. Of course, this can also be the other way around. The sensor heads are arranged at known relative distances, so that any rotation of the substrate table around an axis extending in the third direction of measurement can be determined based on the sensor head measurements.

It is possible that each sensor head is associated with its own grating, which means that in that case the measurement system comprises a first, a second and a third grating. However, in certain embodiments, at least two sensor heads share a grating, which is suitable for measurements in two directions, for example due to the presence of a checkerboard pattern.

It is envisaged that the measurement system for measuring displacements of the substrate table relative to the projection system in all three degrees of freedom in the plane defined by the first and the second direction of measurement using sensor heads as described above is used without a z-sensor. In that case, the sensor heads are mounted onto the substrate table.

In a further alternative embodiment, the measurement system is provided with a first, a second and a third z-sensor. These z-sensors are arranged at known relative positions, so that any rotation of the substrate table around the first direction of measurement and around the second direction of measurement can be determined by their measurements. Preferably all z-sensors cooperate with a grating in measuring the displacements of the substrate table relative to the projection system. This results in a measurement system capable of positional measurement in 6 degrees of freedom (6 DOF).

The invention also provides a device manufacturing method including providing a substrate that is at least partially covered by a layer of radiation-sensitive material, providing a projection beam of radiation using a radiation system, using a patterning device to endow the projection beam with a pattern in its cross-section, projecting the patterned beam of radiation onto a target portion of the layer of radiation-sensitive material, and measuring displacements of one of said support structure and said substrate table in at least two degrees of freedom using at least one grid grating mounted thereon and at least one sensor head.

The invention further provides a method of calibrating a lithographic projection apparatus including providing a reference pattern to a patterning device held in a moveable support structure, said reference pattern having a plurality of reference marks at pre-calibrated positions in at least a scanning direction of the lithographic projection apparatus, holding an image sensor on a substrate table at a constant position relative to the projection lens, positioning said support structure so as to project an image of each of said reference marks in turn onto said transmission image sensor, and measuring the position of said support structure in at least a first degree of freedom when each of the reference marks is projected onto said image sensor.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "exposure area" or "target area", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

The invention is described below with reference to a coordinate system based on orthogonal X, Y and Z directions with rotation about an axis parallel to the I direction denoted Ri. The Z direction may be referred to as "vertical" and the X and Y directions as "horizontal". However, unless the context otherwise demands, this should not be taken as requiring a specific orientation of the apparatus.

BRIEF DESCRIPTION OF THE DRAWINGS

The invention and its attendant advantages will be further described below with reference to exemplary embodiments and the accompanying schematic drawings, in which.

In the drawings, like parts are identified by like references.

DETAILED DESCRIPTION OF THE PREFERRED EMBODIMENTS

Embodiment 1

Figure 1:
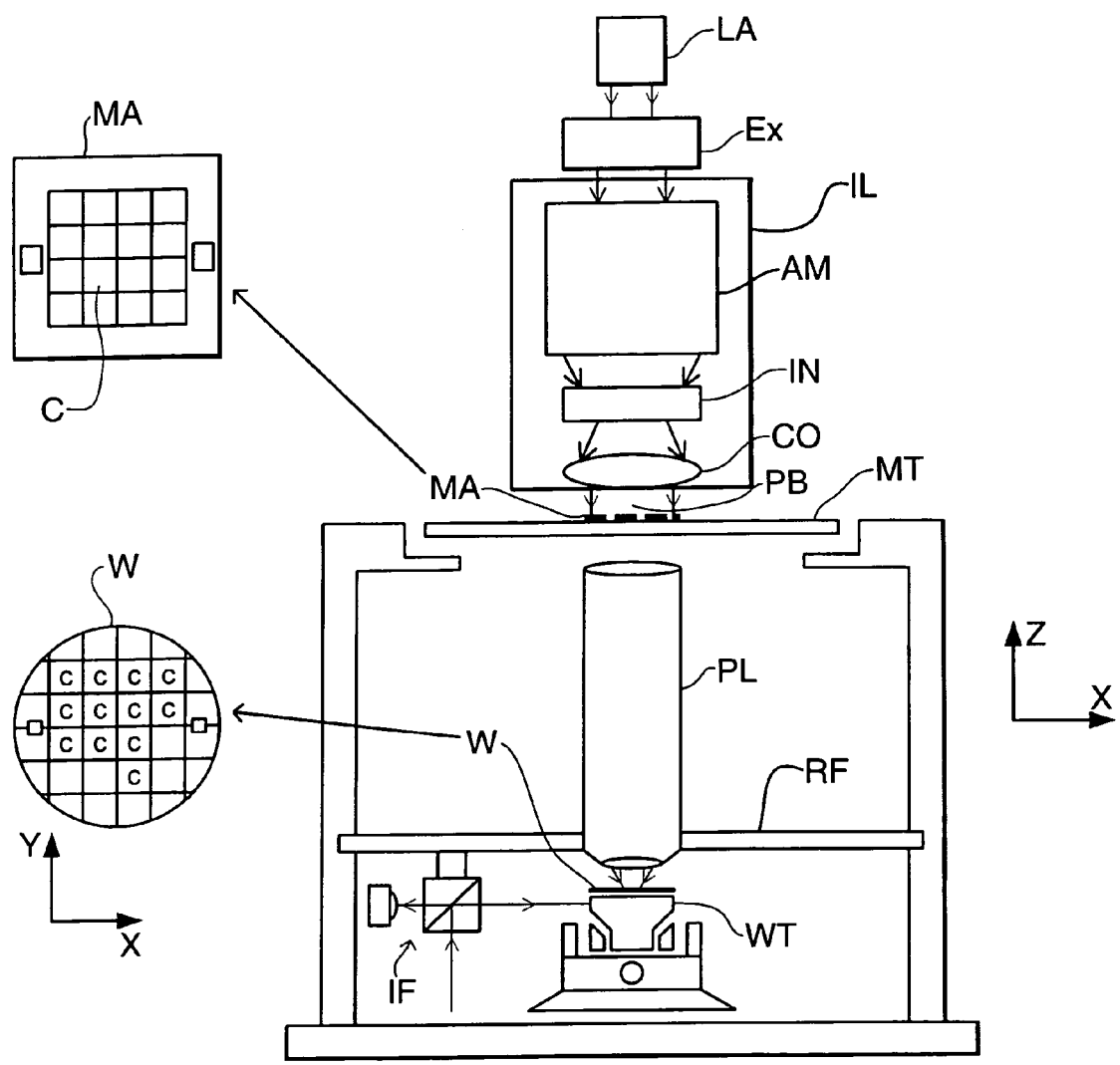
FIG. 1 depicts a lithographic projection apparatus.according to a first embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. UV radiation), which in this particular case also comprises a radiation source LA;

a first object table (mask table) MT provided with a mask holder for holding a mask MA (e.g. a reticle), and connected to first positioning module for accurately positioning the mask with respect to item PL;

a second object table (substrate table) WT provided with a substrate holder for holding a substrate W (e.g. a resist-coated silicon wafer), and connected to second positioning module for accurately positioning the substrate with respect to item PL;

a projection system ("lens") PL (e.g. lens group) for imaging an irradiated portion of the mask MA onto a target portion C (e.g. comprising one or more dies) of the substrate W. As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning optical elements, such as a beam expander Ex, for example. The illuminator IL may comprise adjustable optical elements AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning module (and interferometer IF), the substrate table WT can be moved accurately, e.g. so as to position different target portions C in the path of the beam PB. Similarly, the first positioning module can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

According to the first embodiment of the invention, the displacement measuring system for the mask table comprises a 6 DOF, non-interferometric, nano-metrology system which comprises a table made of Zerodur, on the underside of which are exposed two grid gratings. Each of these gratings, one on either side of the table along the Y-direction, has a measurement range of, for example, 10 mm×500 mm. Two two-coordinate reading heads, mounted on either side of the lens top, measure displacements of the mask table in X, Y, Rz with respect to the lens, with redundant information for X. The two-dimensional gratings are dimensionally stable to nanometer levels over a reasonable temperature range due to the near-zero coefficient of thermal expansion (CCTE) of Zerodur, thus offering a 'permanent' frame of dimensional reference. To minimize any Abbe error due to pitch and roll, the grating should preferably be coplanar to the patterned surface of the mask. Additional indexing channels in X, $Y_1$ and $Y_2$ can also be implemented to provide zero references relative to the lens.

Displacements in the other 3 degrees of freedom (Z, Rx, Ry) can be measured by means of a minimum of 3 nano-height gauges. For the particular case of a transmissive mask, the center portions of the lens and the mask table have to be kept clear. As such, a four-sensor layout is more convenient for implementation.

Similar to displacement in the X-Y plane, it is more convenient to have the sensing target (reflective surface for an optical sensor, or electrode for a capacitive sensor) on the Zerodur table, and the active part of the sensor on the lens top. This avoids, amongst other things, having to route sensor cables to the moving, nano-positioned mask table. The height gauges can use the 2D-grating as their targets, or separate targets can be provided on the Zerodur table.

In contrast with the case of interferometers, the actual mounting positions and orthogonalities of the sensor heads as well as the target surfaces are less critical as long as they remain stable, as they can be determined by a calibration procedure on the lithographic machine. As already mentioned, while laser interferometer is unrivalled in terms of accuracy, the incremental encoder is superior in terms of repeatability due to the sensitivity of the former to environmental conditions.

Gratings for use in the present invention are preferably manufactured using a laser interferometer in a highly controlled environment (e.g. vacuum) to make a master encoder grating with the highest possible accuracy. Then production gratings are replicated from the master—taking advantage of the encoder's inherently high repeatability. The replicas can further be calibrated, either against the master grating or against a vacuum interferometer.

A crucial factor in the practicability of calibration is the spatial frequency content of the errors. An encoder with high spatial-frequency errors will require a high density of calibration data, as well as a high-accuracy reference mark to initialize the application of corrections to measured position data.

Figure 2:
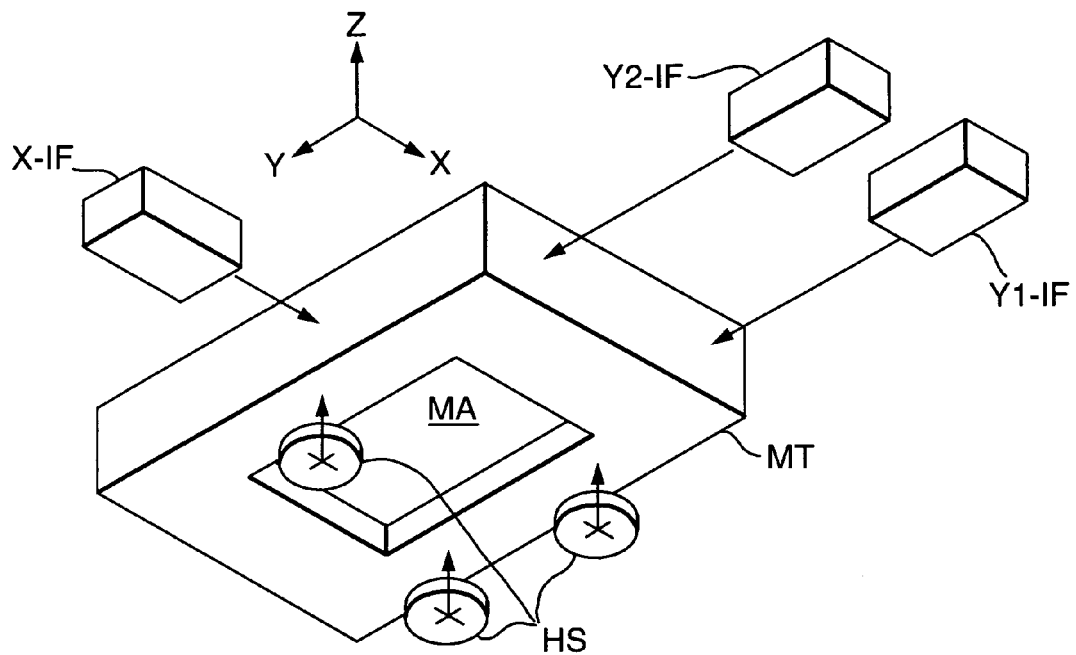
FIG. 2 is a perspective view of the mask stage of a known lithographic apparatus, showing the position measuring system.

Before describing a displacement measurement system according to the present invention, a conventional system will be outlined with reference to FIG. 2 to emphasize the advantages of the present invention.

In the conventional system, the mask table MT has a relatively long range of movement in the Y-direction to accommodate the scan of the mask during the imaging process. Throughout this large-range motion, the Y position of the mask table MT is measured using two Y1-IF, Y2-IF which direct measurement beams against one or more mirrors or reflectors mounted on the mask table MT. The measurement beams are incident on the mask table as two spaced-apart points so that the difference between the two resulting readings can be used to determine the Rz position of the mask table. At at least one extreme of the range of motion of the mask table, the measurement beams will extend over a considerable distance and any variation in the refractive index of the atmosphere through which they pass can therefore introduce a significant error into the position measurements. The X position of the mask table is measured by X-interferometer X-IF. Although the range of motion of the mask table in the X-direction is considerably smaller than that in the Y-direction, so the optical path length of the X-interferometer does not need to be so long, the X-interferometer must provide a measurement of X position throughout the range of motion of the mask table in the Y-direction. This requires that the measurement beam of the X-interferometer X-IF must be directed onto a mirror mounted on the side of the mask table MT and having a length greater than the scanning range of the mask table MT.

In the conventional system, the three interferometers provide measurements of displacements of the mask table in three degrees of freedom, namely X, Y and Rz (yaw). The position in the other three degrees of freedom, i.e. Z, Rx (pitch) and Ry (roll), is provided by appropriate processing of the outputs from three height sensors HS which measure the vertical position of three points spaced apart on the bottom of the mask table MT.

Figure 3:
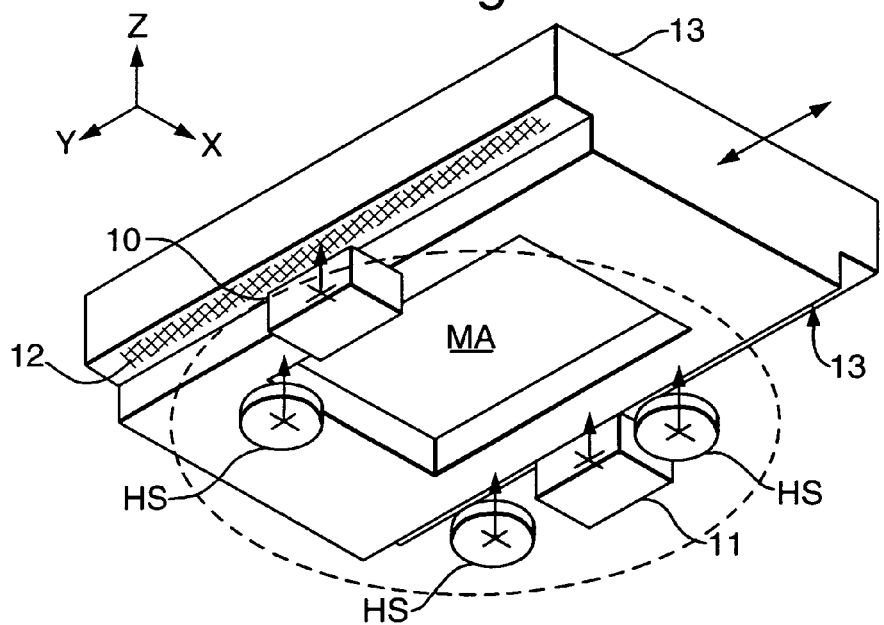
FIG. 3 is a perspective view of the mask stage of a lithographic apparatus, showing the position measuring system according to a first embodiment of the invention.

By way of comparison, the arrangement according to the first embodiment of the present invention is shown in FIG. 3. In place of the interferometers Y1-IF, Y2-IF and X-IF, the present invention employs two optical reading heads 10, 11 which measure displacements of respective grid gratings 12, 13. The grid gratings 12, 13 are provided one on either side of the mask MA and have a length in the Y-direction sufficient to accommodate the entire scanning range of motion, indicated by the double-headed arrow, of the mask table MT. The grid gratings 12, 13 are positioned on cut-away portions so that they are substantially co-planar with the pattern on the mask MA. The encoder reading heads 10, 11, as well as three height sensors HS, are mounted on, or fixed relative to, the upper element of the projection system, represented by the dashed oval in FIG. 3.

The encoder reading heads 10, 11 can be actively temperature-controlled, e.g. by incorporating a water-cooling jacket, to remove any heat dissipated by them and maintain thermal stability of the reading head itself and the projection optics to which they are mounted. Also, the light source and the detectors of the reading head can be located remotely and coupled to the reading head via optical fibers, so as to minimize any local heat generation and maintain the highest possible pointing stability in the reading head optics.

As can be seen from FIGS. 2 and 3, the encoder measurement system is much more compact, and removes the need for extending the metrology reference frame from the wafer level to the reticle level, the two being some 1m apart in the vertical direction. The resultant design of the metrology frame is much simpler and more compact, with substantial improvements in its dynamic characteristics. The concept can be taken further to measure the X-Y position of the mask itself relative to the projection optics. This can be done by putting a reflective grating directly on the chrome border around the pattern area of the mask. While this increases the costs of the mask, any distortions in the plane of the mask due to e.g. dimensional changes during processing can be automatically accounted for. The availability of a reference index position in X, Y and Rz is yet an additional bonus.

It is important that the encoder system of the present invention, which is highly repeatable but not absolutely accurate, is calibrated to an absolute length reference such as a vacuum interferometer. The calibration should ideally be carried in an offline calibration platform but also in-situ in the machine for monitoring long-term drifts.

For offline calibration, the encoder grating, together with the reading head, can be calibrated directly in the scan (Y) direction against a length reference system such as a vacuum interferometer. This is a one-time measurement and can be carried out outside the machine under controlled conditions. The error map so obtained can be stored in a look-up error table or as coefficients of polynomials in an error correction routine implemented on the machine. The error map can be calibrated not only in the Y, but also in the X direction to account for any X-displacement dependence. Calibration in the transverse (X) direction is performed using a reference plane-mirror interferometer system against a reference flat mirror, due to the long travel range in Y.

To effect in-situ calibration in the apparatus it would be desirable to provide a reference interferometer system but space requirements generally prohibit this. Instead, a calibration scheme in which the calibration in the scan direction is divided into three parts—the area of the mask, over the area corresponding to the illumination field at both ends of the mask and the rest of the range—is used.

In the central part of the movement range where the mask passes through the central line of the optical system, the encoder system can be calibrated using a reference mask (e.g. an ultra-flat mask made of Zerodur) on which a large number of reference marks are printed and exposed. The aerial images of the reference marks are detected by a transmission image sensor mounted on the substrate table WT which is held relative to the reference frame RF in a constant position using the wafer stage interferometer system IF. Meanwhile, the reference mask is moved in the mask stage to successive markers and the position of the encoder noted and compared to the pre-calibrated position of the marker on the reference mask. The position of the markers on the reference mask can be pre-calibrated to an absolute length standard, offline and on a regular basis.

The X-dependence of the encoder in the scan direction can also be calibrated by shifting the mask off-center, as well as the substrate table WT by an equivalent amount, and repeating the above procedure at a plurality of off-centered positions.

The range of movement immediately outside the mask area at both ends (equal to the size of the exposure slit at reticle level) is also of crucial importance to the overlay quality of the exposure. A highly accurate calibration in these areas can be obtained without including the error induced by lens distortion by shifting the substrate table WT such that the transmission image sensor catches at the outermost position of the exposure field in the scan direction. The calibration described for the central area is then repeated over the entire length of the mask with transmission image sensor kept stationary relative to the reference frame in the off-centered position. The error map produced by this procedure is combined to the original map at the center position using, for example, a least-square fitting routine.

Outside the above two ranges, where the mask table MT is in the acceleration or setting phase, the motion cycle has little impact on the actual overlay quality of the exposure and accuracy requirements are therefore less stringent. High spatial frequency errors of the encoder system in these regions can be calibrated by setting the mask table MT in motion at constant velocity and under low-bandwidth server control such that the inertia of the mask table is used to filter out any velocity fluctuations. The velocity is then assumed constant and any irregularity in the position data rate of the encoder system gives a measure of any high frequency errors.

Calibration of the encoder system in the X direction can be carried out similarly using a number of markers on the reference mask along a transverse axis. For the calibration of the X dependence due to Y movements, the mask table MT can be moved in the scan direction, using the now corrected Y axes to maintain constant yaw (Rz) and recording any cross talk of X position from Y using two X-measuring heads.

Figure 4:
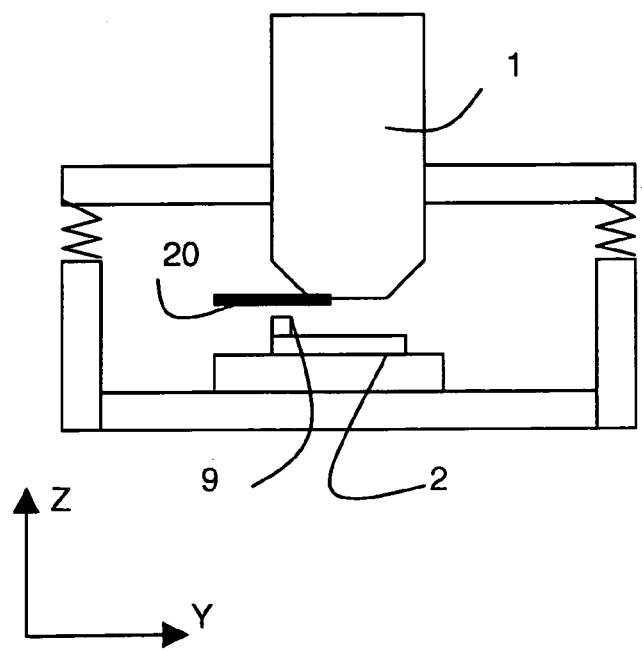
FIG. 4 shows a second embodiment of a lithographic apparatus according to the invention.
Figure 5:
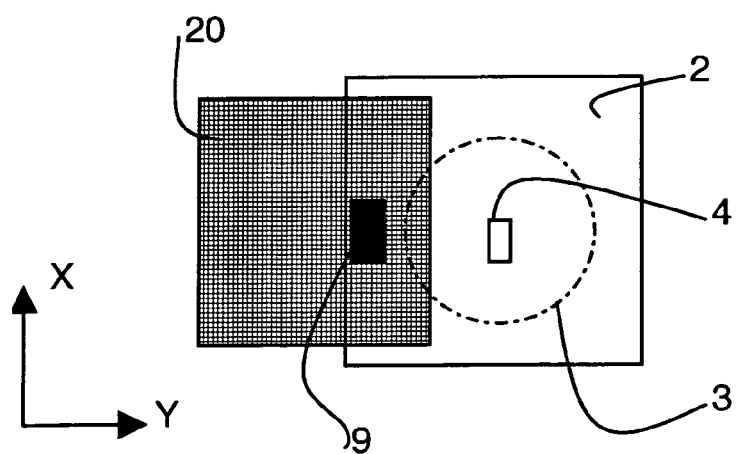
FIG. 5 shows a top view of the embodiment of FIG. 4.

FIG. 4 and FIG. 5 show an embodiment of a lithographic apparatus according to the invention. Projection system 1 is adapted to project a patterned beam 4 of radiation onto a substrate 3. A substrate table 2 is provided to carry the substrate 3. For monitoring displacement of the substrate table 2 relative to the projection system 1, a measurement system is provided.

In the embodiment of FIG. 4 and FIG. 5, the measurement system comprises a sensor unit 9 and a first grating 20. The sensor unit 9 is mounted on top of the substrate table 2. The sensor unit 9 cooperates with first grating 20, which is mounted onto the projection system 1 for determining displacement of the substrate table 2 in the x-y-plane relative to the projection system 1. The sensor unit 9 and the first grating 20 are arranged relative to each other in such a way that the sensor unit 9 and the first grating 20 are able to cooperate during all expected movements of the substrate table 2 relative to the projection system 1.

In the central part of the movement range where the mask passes through the central line of the optical system, the encoder system can be calibrated using a reference mask (e.g., an ultra-flat mask made of Zerodur) on which a large number of reference marks are printed and exposed. The aerial images of the reference marks are detected by a transmission image sensor mounted on the substrate table WT which is held relative to the reference frame RF, as illustrated in FIG. 1, in a constant position using the wafer stage interferometer system IF. Meanwhile, the reference mask is moved in the mask stage to successive markers and the position of the encoder noted and compared to the pre-calibrated position of the marker on the reference mask. The position of the markers on the reference mask can be pre-calibrated to an absolute length standard, offline and on a regular basis.

In a sensor unit, a plurality of optical reading heads can be provided. Also, the first grating can be two-dimensional to make measurements in of displacement two or three degrees of freedom possible.

For measuring displacement of the substrate table 2 relative to the projection system 1 in a first direction of measurement which corresponds to displacement in one translational degree of freedom, the sensor unit 9 comprises a first reading head 8. The first grating 20 then comprises a first group of mutually parallel lines 21, extending perpendicular to the first direction of measurement. The direction of the parallel lines 21 of the first group and the first direction of measurement together define a first plane. The first reading head 8 is adapted to send a first polarized beam 15 of radiation to the first grating 20 in a direction perpendicular to the first plane.

Figure 6:
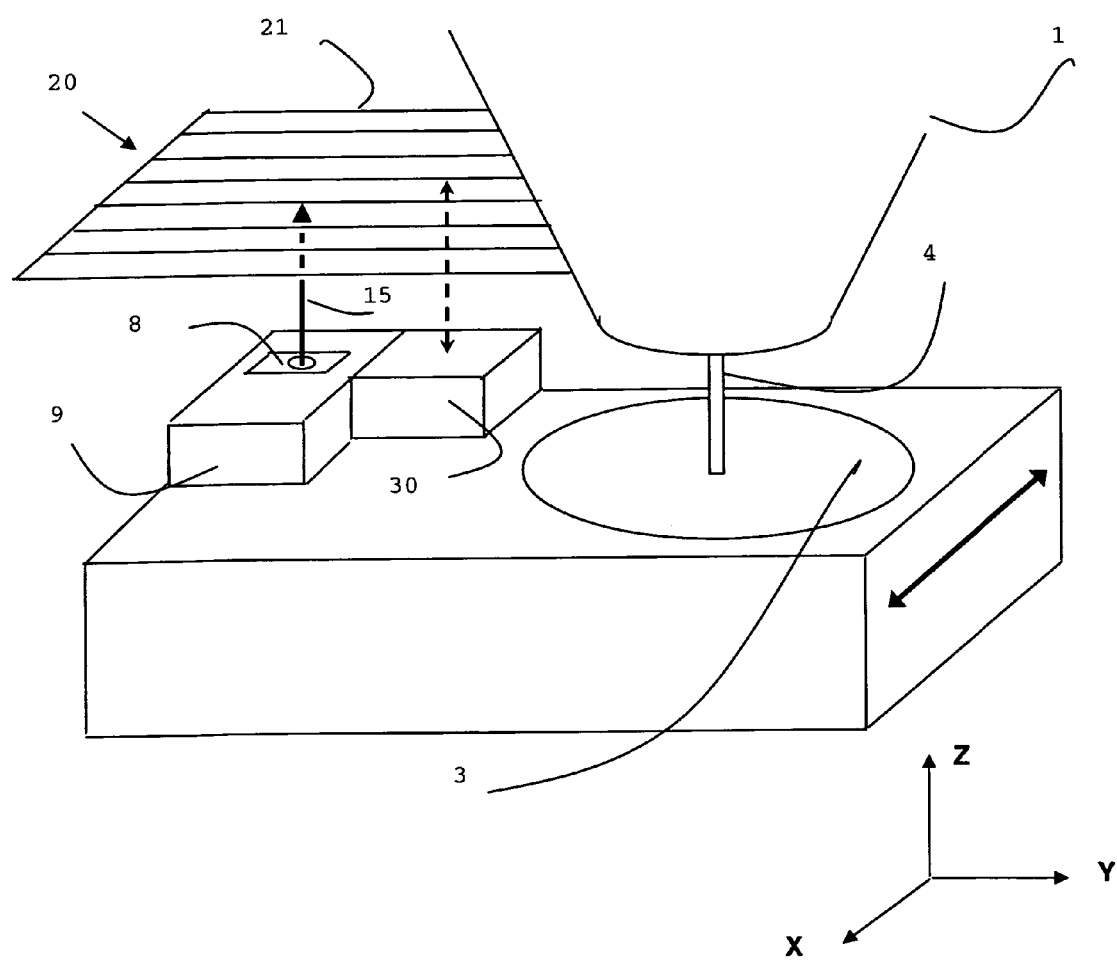
FIG. 6 shows a third embodiment of a lithographic apparatus according to the invention.

For example, when displacement of the substrate table 2 relative to the projection system 1 in x-direction is to be measured, and the first grating 20 is mounted onto the projection system 1 (that is: at a distance from the substrate table 2 in z-direction). In that case, the first direction of measurement is the x-direction and the lines of the grating extend in y-direction. Together, the first direction of measurement (x-direction) and the direction of the lines 21 of the first grating 20 (y-direction) define a first plane (x-y-plane). The polarized beam 15 of radiation the sensor head generates is directed in z-direction. This is illustrated in FIG. 6.

Instead of being mounted to the projection system 1, it is also possible that the first grating 20 is mounted on a frame that is substantially stationary to the projection system 1, such that the first grating 20 is spaced from the substrate table 2 in y-direction. In that case, the lines 21 of the first grating 20 extend in z-direction.

In the lithographic apparatus according to the invention, the measurement system may also comprises a first z-sensor 30. The z-sensor 30 and the first grating 20 cooperate in determining the displacement of the substrate table 2 relative to the projection system 1 in a third direction of measurement. This third direction of measurement is perpendicular to the plane defined by the first direction of measurement and the direction of the lines of the first grating 20. So, when the first direction of measurement is the x-direction and the parallel lines 21 of the first grating 20 extend in y-direction, the third direction is the z-direction. So, in the lithographic apparatus according to the invention, if a first grating 20 that is used for measuring the displacement of the substrate table 2 in either x- or y-direction, and sensor unit 9 is mounted on top of substrate table 2, adapted to send a polarized beam 15 in z-direction to first grating 20, the first grating 20 is used for measuring displacement of the substrate table 2 in the x- or y-direction as well as in the z-direction.

In a possible embodiment, the z-sensor 30 is an interferometer. In that case the first grating 20 has a reflective face cooperating with the interferometer. It is envisaged that the grating comprises two, mutually parallel reflective faces, for example due to the nature of the grating. This can be the case if the grating comprises two groups of parallel lines. In such a case, the distance between the reflective faces is preferably n times the wavelength of the beam 15 of the interferometer, n being a positive integer (1,2,3,4 . . . ).

Alternatively, the z-sensor 30 can be a capacitive sensor. For functioning, a capacitive sensor needs an electrically conductive counter plate, that is arranged at a small distance, such as a few millimeters, from the capacitive sensor in the direction of measurement. By making at least a part of the first grating 20 electrically conductive, the first grating 20 serves as a counter plate for the capacitive sensor. It is known to make gratings out of glass, with lines of chromium. By interconnecting the lines and connecting them to ground, such a grating can be used with a capacitive sensor.

Figure 7:
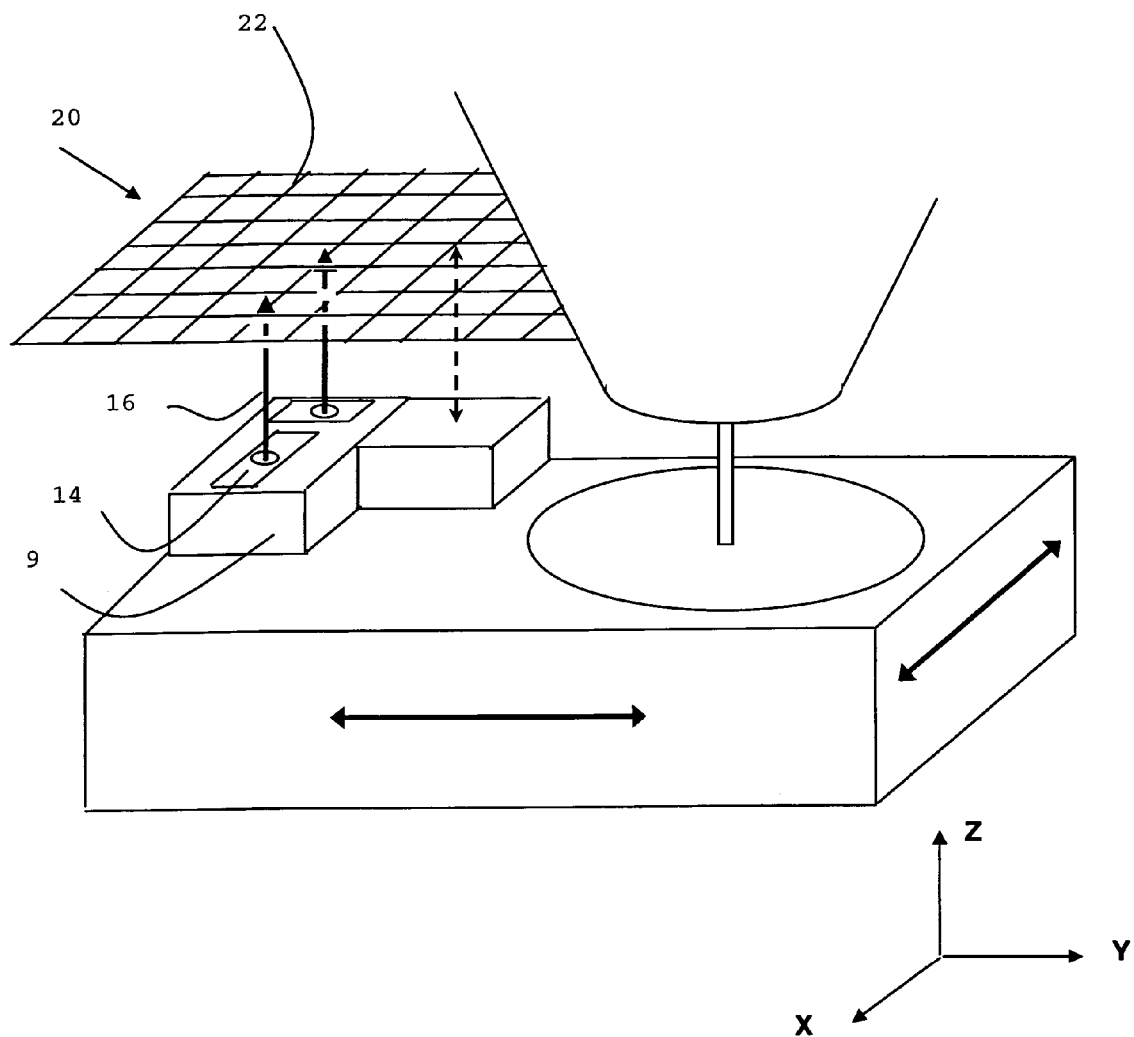
FIG. 7 shows a fourth embodiment of a lithographic apparatus according to the invention.

The embodiment of FIG. 6 can be adapted for measuring displacement of the substrate table 2 relative to the projection system 1 in both the x-direction and the y-direction. Such an adapted embodiment is shown in FIG. 7. The sensor unit 9 in the embodiment of FIG. 7 comprises a second reading head 14, which sends a second polarized beam 16 of radiation to the first grating 20. In order to measure the displacement in the Y-direction, the grating should also have a periodically alternating pattern in the Y-direction. The first grating 20 comprises a second group of mutually parallel lines 22. The parallel lines 22 of the second group extend in x-direction. Thus, a two-dimensional first grating 20 is created. Instead of a first grating 20 of the type shown in FIG. 5, a two-dimensional first grating with a checkerboard pattern can be applied. The transitions between the dark and the light areas of the pattern function in the way as the mutually parallel lines 21, 22 of the first grating 20 according to FIG. 5. In order to provide information regarding the position of the grating relative to the reading head, the grating can be equipped with any alternating or varying pattern. Examples of such patterns are parallel lines, alternating patterns of light and dark areas, areas with different colors or different properties with respect to reflection or absorption of the beam applied by the sensor unit.

As an alternative for the embodiment of FIG. 7, a first and a second sensor unit 9, 19 may be used. In that case, the first sensor unit 9 comprises the first sensor head 8, and the second sensor unit 19 comprises the second sensor head 14.

In an alternative embodiment, the measurement system can be such that each sensor head 8, 14, either in the sensor unit 9 according to FIG. 7 or in the alternative embodiment with a separate first and second sensor head, cooperates with a separate, dedicated grating.

In another embodiment, the measurement system is adapted to measure displacement of the substrate table 2 relative to the projection system 1 in all three degrees of freedom in the x-y-plane (translation in x-direction, translation in y-direction and rotation about the z-axis, which rotation is referred to as the Rz-direction). To this end, the measurement system comprises a first, a second and a third sensor head 8, 14, 18. Two of the sensor heads detect displacement of the substrate table 2 relative to the projection system 1 in the same direction (for example the x-direction), and the other sensor detects displacement of the substrate table 2 relative to the projection system 1 in the other direction (in the give example: the y-direction). The sensor heads 8, 14, 18 are arranged at known relative distances, so that any rotation of the substrate table 2 around an axis extending in the third direction of measurement can be determined based on the sensor head measurements.

Figure 8A:
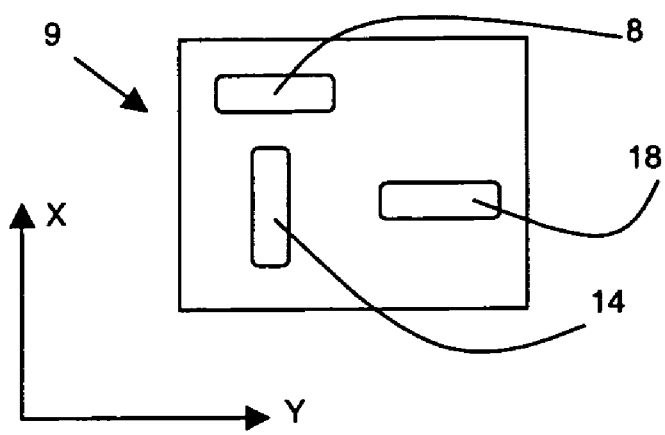
FIG. 8a-b show possible arrangements of multiple sensor heads in a sensor unit.
Figure 8B:
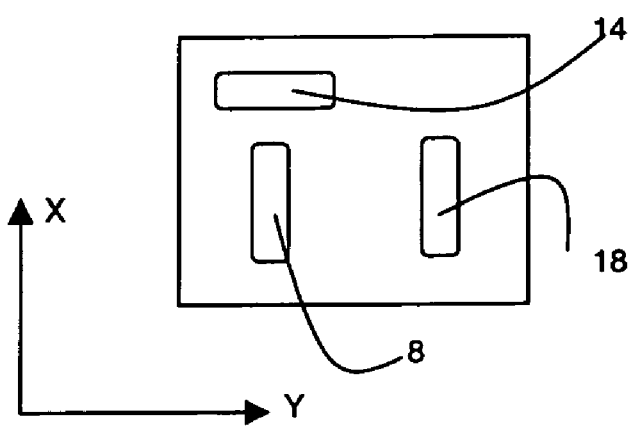

It is envisaged that the first, second and third sensor heads 8, 14, 18 are accommodated in a single sensor unit 9, as shown in FIG. 8a and FIG. 8b. In FIG. 8a, the sensor unit 9 comprises two sensor heads 8,18 for measuring displacement of the substrate table 2 relative to the projection system 1 in x-direction, and one sensor head 14 for measuring displacement of the substrate table 2 relative to the projection system 1 in y-direction. In the embodiment of FIG. 8b, the sensor unit 9 comprises one sensor head 14 for measuring displacement of the substrate table 2 relative to the projection system 1 in x-direction, and two sensor heads 8, 18 for measuring displacement of the substrate table 2 relative to the projection system 1 in y-direction.

Figure 9:
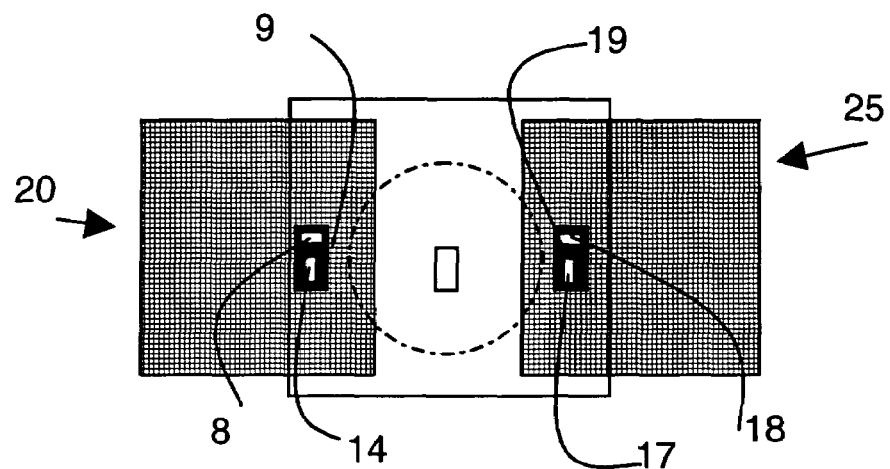
FIG. 9 shows a fifth embodiment of a lithographic apparatus according to the invention.

Another embodiment is shown in FIG. 9. In the embodiment of FIG. 9, the measurement system comprises a first sensor unit 9 and a second sensor unit 19. The first sensor unit 9 comprises a first sensor head 8 and a second sensor head 14, while the second sensor unit 19 comprises a third sensor head 18 and a fourth sensor head 17. The sensor heads 8, 14 of the first sensor unit 9 cooperate with a first grating 20. The sensor heads 18, 17 of the second sensor unit 19 cooperate with a second grating 25. Both the first and the second grating 20, 25 are provided with a checkerboard pattern or with a first and a second group of mutually parallel lines, so that both sensor units 10,19 are adapted to measure displacement of the substrate table 2 relative to the projection system 1 in x-direction and in y-direction.

This embodiment may be particularly useful in view of potential improvements in the resolution of the measurement of the rotational displacement around the z-axis of the substrate table 2 relative to the projection system 1.

Figure 10:
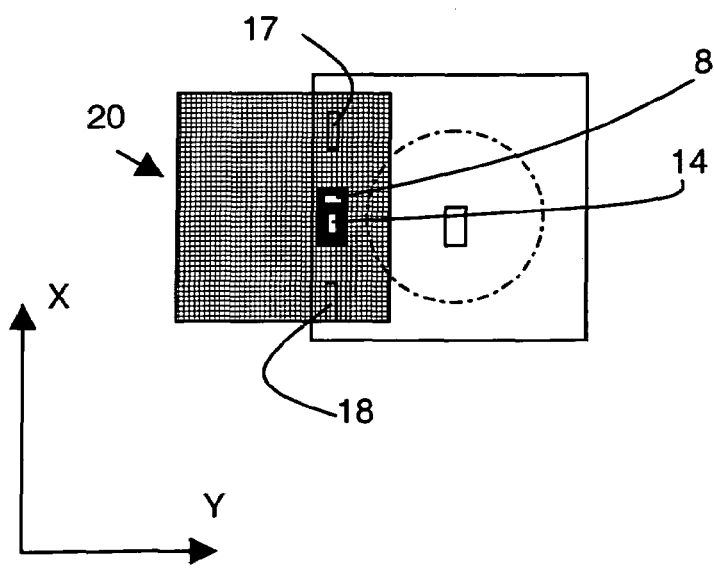
FIG. 10 shows a sixth embodiment of a lithographic apparatus according to the invention.

FIG. 10 shows an embodiment in which a first sensor unit 9, comprising a first sensor head 8 for measuring displacement in x-direction, and a second sensor head 14 for measuring displacement in y-direction, is combined with a third sensor head 18 for measuring displacement in y-direction and a fourth sensor head 17 for measuring displacement in y-direction. All sensor heads 8,14,18,17 cooperate with a two-dimensional first grating 20. In the arrangement of FIG. 10, displacements of the substrate table 2 in x-, y- and Rz-direction are measured using the first sensor unit 9 and either the third of the fourth sensor head 17, 18, depending on which one has a beam of radiation in contact with the first grating 20.

Figure 11:
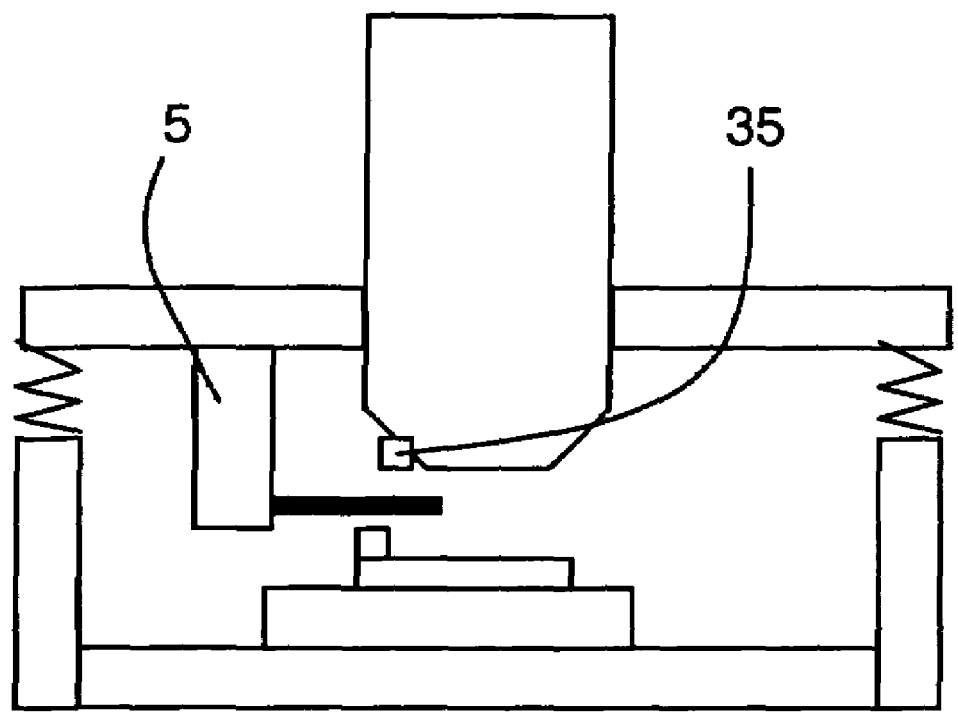
FIG. 11 shows a seventh embodiment of a lithographic apparatus according to the invention.
Figure 11:
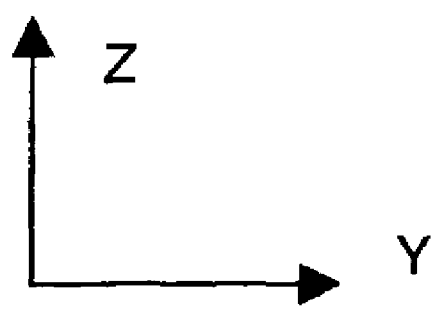

FIG. 11 shows an embodiment in which the first grating 20 is attached to a frame 5 instead of directly to the projection system 1. Preferably, this frame 5 in at least substantially stationary relative to the projection system 1, that is: the relative displacement of the part of the frame 5 the grating is attached to and the projection system 1 is negligible. If the relative displacement of the part of the frame 5 the grating is attached to and the projection system 1 is not negligible, the lithographic apparatus is preferably provided with an additional sensor 35. This additional sensor 35 determines the relative displacement of the part of the frame 5 the grating is attached to and the projection system 1. This relative displacement is then taken into account when the displacement of the substrate table 2 relative to the projection system 1 is determined.

It is envisaged that the embodiments shown in the FIGS. 2 to 11 can be used without the presence of a z-sensor that cooperates with a grating.

Figure 12:
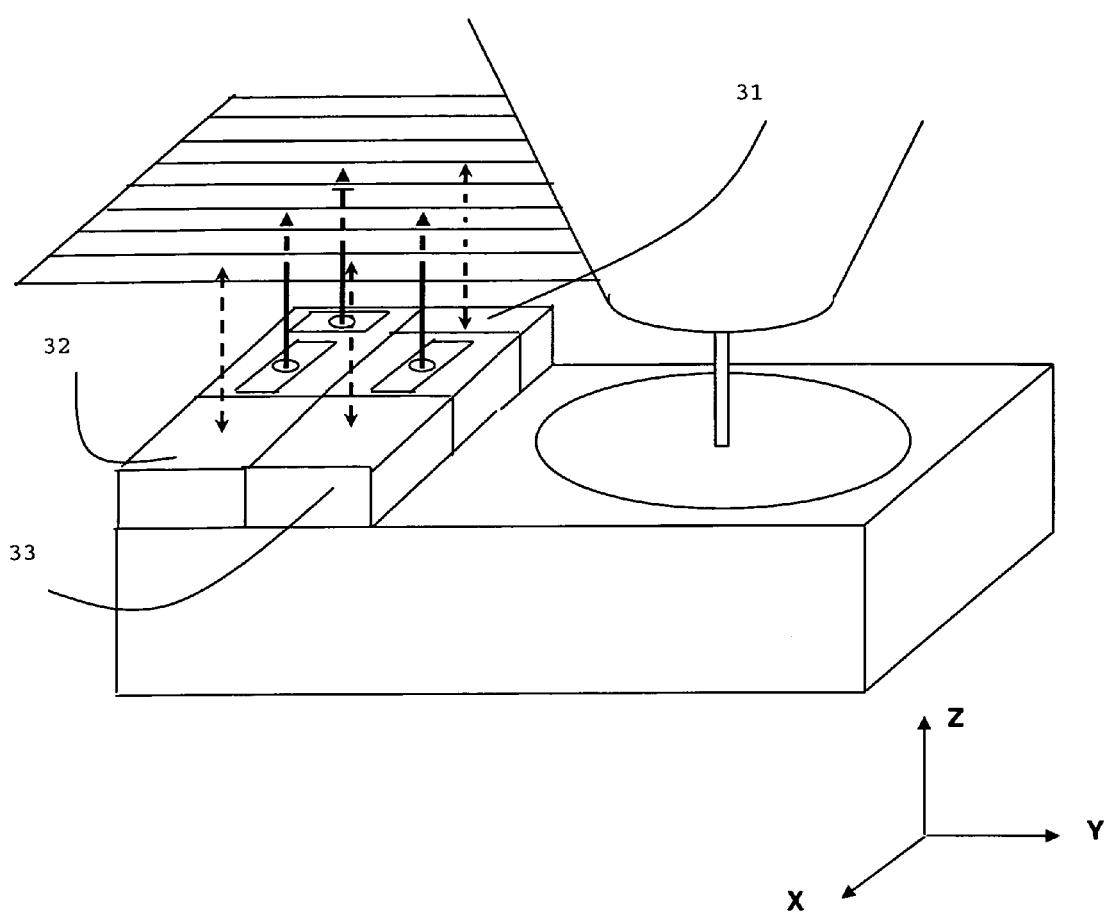
FIG. 12 shows an eight embodiment of a lithographic apparatus according to the invention.

In another embodiment (shown in FIG. 12), the measurement system comprises a first, a second and a third z-sensor 31, 32, 33. These z-sensors 31, 32, 33 are arranged at known relative positions, so that any rotation of the substrate table 2 around the x-axis (Rx) and around the y-axis (Ry) can be determined by their measurements. Preferably all z-sensors cooperate with the first grating 20 in measuring the displacements of the substrate table 2 relative to the projection system 1. It is however envisaged that is it possible that different z-sensors 31, 32, 33 cooperate with different gratings. The z-sensors 31, 32, 33 of the embodiment of FIG. 12 can be combined with any of the embodiments shown in FIGS. 2-11.

While we have described above specific embodiments of the invention it will be appreciated that the invention may be practiced otherwise than described. The description is not intended to limit the invention. In particular, while the described embodiment is a system for measuring the position of a mask table in a lithographic apparatus, it will be appreciated that the invention is equally applicable to substrate (wafer) tables and to multiple stage; devices. Also, the grid grating can be mounted on a fixed part of the apparatus, such as a metrology or reference frame, and the sensor head can be mounted on the moveable object.

What is claimed is:

1. A lithographic projection apparatus comprising:
   a support structure configured to support a patterning device, the patterning device serving to pattern a beam of radiation according to a desired pattern;
   a substrate table configured to hold a substrate;
   a projection system configured to project the patterned beam onto a target portion of the substrate; and
   a displacement measuring system configured to measure the position of a moveable object in at least two degrees of freedom, the moveable object comprising said support structure or said substrate table, said displacement measuring system comprising at least one grid grating mounted on said moveable object and at least one sensor head configured to measure displacements of said grid grating in two degrees of freedom,
   wherein the at least one grid grating includes a reference mark detectable by the respective sensor head for defining a reference position of the moveable object.

2. An apparatus according to claim 1, wherein said grid grating is incorporated directly into the main body of said moveable object.

3. An apparatus according to claim 1, wherein said displacement measuring system further comprises a memory configured to store correction information representing differences between said grid grating and an ideal grid grating and a data processing unit configured to correct measurements output by said sensor head.

4. An apparatus according to claim 1, wherein said displacement measuring system further comprises one or more capacitive or optical sensors configured to measure the position of said moveable object in degrees of freedom not measured by said grid grating and sensor head.

5. An apparatus according to claim 1, wherein said sensor head comprises an encoder head.

6. An apparatus according to claim 1, wherein said displacement measuring system further comprises an interpolator configured to interpolate the output of the or each sensor head.

7. An apparatus according to claim 1, wherein the support structure comprises a mask table for holding a mask.

8. A lithographic projection apparatus, comprising:
  a support structure configured to support a patterning device, the patterning device serving to pattern a beam of radiation according to a desired pattern;
  a substrate table configured to hold a substrate;
  a projection system configured to project the patterned beam onto a target portion of the substrate; and
  a displacement measuring system configured to measure the position of a moveable object in at least two degrees of freedom, the moveable object comprising said support structure or said substrate table, said displacement measuring system comprising two grid gratings mounted on said moveable object at spaced apart locations and two sensor heads each configured to measure displacements of a respective one of said grid gratings in two degrees of freedom.

9. A lithographic projection apparatus comprising:
  a support structure configured to support a patterning device, the patterning device serving to pattern a beam of radiation according to a desired pattern;
  a substrate table configured to hold a substrate;
  a projection system configured to project the patterned beam onto a target portion of the substrate; and
  a displacement measuring system configured to measure the position of a moveable object comprising one of said support structure and said substrate table in at least two degrees of freedom, said displacement measuring system comprising at least one grid grating mounted on a reference frame and at least one sensor head mounted on said moveable object configured to measure displacement of said moveable object relative to said grid grating in two degrees of freedom.

10. An apparatus according to claim 9, wherein the at least one sensor head is an optical encoder.

11. An apparatus according to claim 9, wherein the at least one grid grating is a two-dimensional grating.

12. An apparatus according to claim 9, wherein the reference frame is substantially stationary relative to the projection system.

13. An apparatus according to claim 9, wherein the displacement measuring system further comprises a second sensor head,
  wherein the at least one grid grating is a two-dimensional grating,
  wherein the at least one sensor head is configured to cooperate with the at least one grid grating to measure a displacement of the moveable object along a first direction, and
  wherein the second sensor head is configured to cooperate with the at least one grid grating to measure a displacement of the moveable object along a second direction, the second direction substantially perpendicular to the first direction.

14. An apparatus according to claim 9, wherein the displacement measuring system includes a second grid grating that is substantially parallel to the at least one grid grating and a second sensor head mounted on the moveable object and configured to cooperate with the second grid grating to measure a displacement of the moveable object relative to the second grid grating in two degrees of freedom.

15. An apparatus according to claim 9, wherein the at least one sensor head is configured to cooperate with the at least one grid grating to measure a displacement of the moveable object in a plane substantially parallel to a functional surface of the patterning device.

16. An apparatus according to claim 15, wherein the reference frame is the projection system.

17. An apparatus according to claim 9, wherein the displacement measuring system further comprises a second sensor head mounted on the moveable object,
  wherein the displacement measured by the at least one sensor head is in a plane substantially parallel to a functional surface of the patterning device; and
  wherein the second sensor head is configured to cooperate with the at least one grid grating to measure a displacement of the moveable object along a direction substantially perpendicular to the plane.

18. An apparatus according to claim 17, wherein the second sensor head is an interferometer head and the at least one sensor head is an optical encoder head.

19. An apparatus according to claim 17, wherein the at least one grid grating includes two substantially parallel reflective faces.

20. An apparatus according to claim 17, wherein the second sensor head is a capacitive sensor.

21. An apparatus according to claim 17, wherein the at least one grid grating is a two-dimensional grating.

22. An apparatus according to claim 21, wherein the at least one sensor head is configured to measure the displacement of the moveable object along two substantially perpendicular directions.

23. A lithographic projection apparatus comprising:
  a support structure configured to support a patterning device, the patterning device serving to pattern a beam of radiation according to a desired pattern;
  a substrate table configured to hold a substrate;
  a projection system configured to project the patterned beam onto a target portion of the substrate; and
  a displacement measuring system configured to measure the position of a moveable object in at least two degrees of freedom, the moveable object comprising said support structure or said substrate table, said displacement measuring system comprising at least one grid grating mounted on said moveable object and at least one sensor head configured to measure displacements of said grid grating in two degrees of freedom,
  wherein said moveable object is moveable in a first direction for scan imaging and said grid grating has a length in said first direction greater than or equal to the range of motion of said moveable object in said first direction.

24. A lithographic projection apparatus comprising:
  a support structure configured to support a patterning device, the patterning device serving to pattern a beam of radiation according to a desired pattern;
  a substrate table configured to hold a substrate;
  a projection system configured to project the patterned beam onto a target portion of the substrate; and
  a displacement measuring system configured to measure the position of a moveable object in at least two degrees of freedom, the moveable object comprising said support structure or said substrate table, said displacement measuring system comprising at least one grid grating mounted on said moveable object and at least one sensor head configured to measure displacements of said grid grating in two degrees of freedom, wherein the grid grating is positioned so as to be substantially coplanar with the functional surface of said patterning device supported by said support structure or a substrate held by said substrate table.

25. A device manufacturing method comprising:

projecting a patterned beam of radiation onto a target portion of a layer of radiation-sensitive material on a substrate;

measuring displacements of one of a support structure for a patterning device for patterning the beam of radiation and a substrate table for holding the substrate, in at least two degrees of freedom using at least one grid grating mounted thereon and at least one sensor head, wherein the at least one grid grating includes a reference mark detectable by the respective sensor head for defining a reference position of said moveable object; and supplying or making available the measured displacements for further analysis or processing.

26. A device manufactured according to the method of claim 25.

27. A method according to claim 25, wherein said measuring displacements further comprises measuring a displacement in a z-direction perpendicular to a plane substantially parallel to a surface of the target portion.

* * * * *